United States Patent [19]

Adlerstein

[11] 4,160,992
[45] Jul. 10, 1979

[54] PLURAL SEMICONDUCTOR DEVICES MOUNTED BETWEEN PLURAL HEAT SINKS

[75] Inventor: Michael G. Adlerstein, Wellesley, Mass.

[73] Assignee: Raytheon Company, Lexington, Mass.

[21] Appl. No.: 833,322

[22] Filed: Sep. 14, 1977

[51] Int. Cl.² .................... H01L 23/02; H01L 29/48; H01L 29/56
[52] U.S. Cl. .................................. 357/81; 357/15; 357/56; 357/75
[58] Field of Search ................ 357/55, 56, 75, 76, 357/81, 15

[56] References Cited
U.S. PATENT DOCUMENTS

| | | | |
|---|---|---|---|
| 3,176,202 | 3/1965 | Uhlir | 357/76 |
| 3,231,794 | 1/1966 | Diebold | 357/75 |
| 3,249,891 | 5/1966 | Rutz | 357/75 |
| 3,320,497 | 5/1967 | Neuf | 357/56 |
| 3,469,171 | 9/1969 | Toulemonde | 357/81 |
| 3,551,842 | 12/1970 | Nelson | 357/56 |
| 3,649,881 | 3/1972 | Chang et al. | 357/81 |
| 3,686,541 | 8/1972 | Livezey et al. | 357/81 |
| 3,728,236 | 4/1973 | Weller et al. | 357/56 |
| 3,740,617 | 6/1973 | Teramoto et al. | 357/81 |
| 3,903,592 | 9/1975 | Hecki | 357/56 |
| 3,932,226 | 1/1976 | Kiatskin et al. | 357/75 |
| 3,956,820 | 5/1976 | Swartz et al. | 357/56 |
| 4,030,943 | 6/1977 | Lee et al. | 357/56 |
| 4,034,394 | 7/1977 | Kamo et al. | 357/56 |

Primary Examiner—Andrew J. James
Attorney, Agent, or Firm—Richard M. Sharkansky; Joseph D. Pannone; Milton D. Bartlett

[57] ABSTRACT

A microwave semiconductor device with improved thermal properties is disclosed wherein multiple active semiconductor bodies are disposed between two electrically and thermally isolated heat sinks. Two separate thermal paths are provided for heat produced within the semiconductor material. The maximum operating power of devices such as double-drift IMPATT diodes is greatly extended.

5 Claims, 10 Drawing Figures

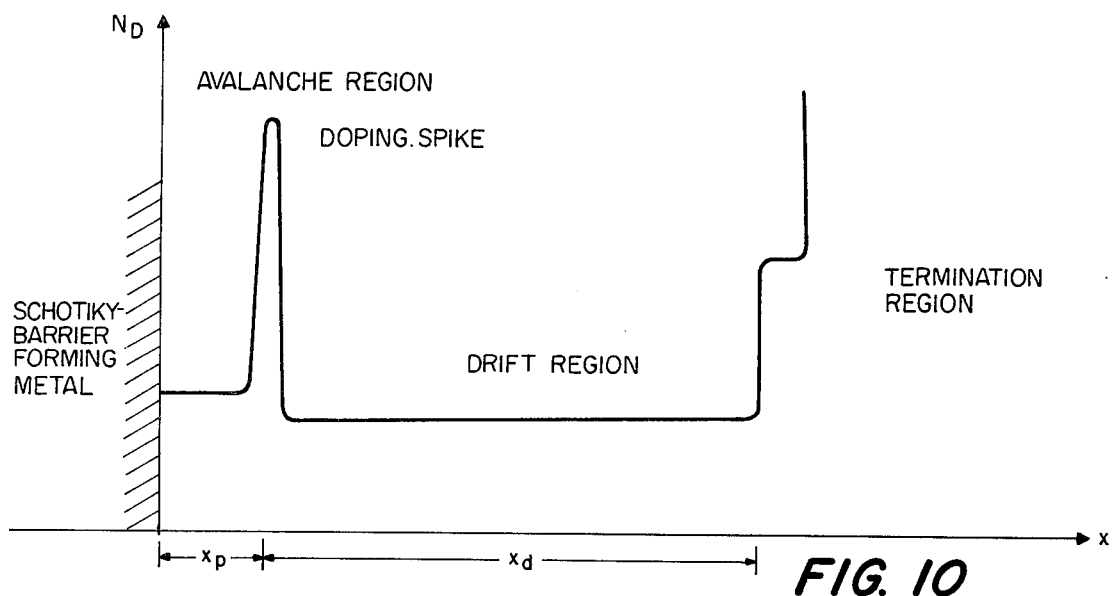
FIG. 10
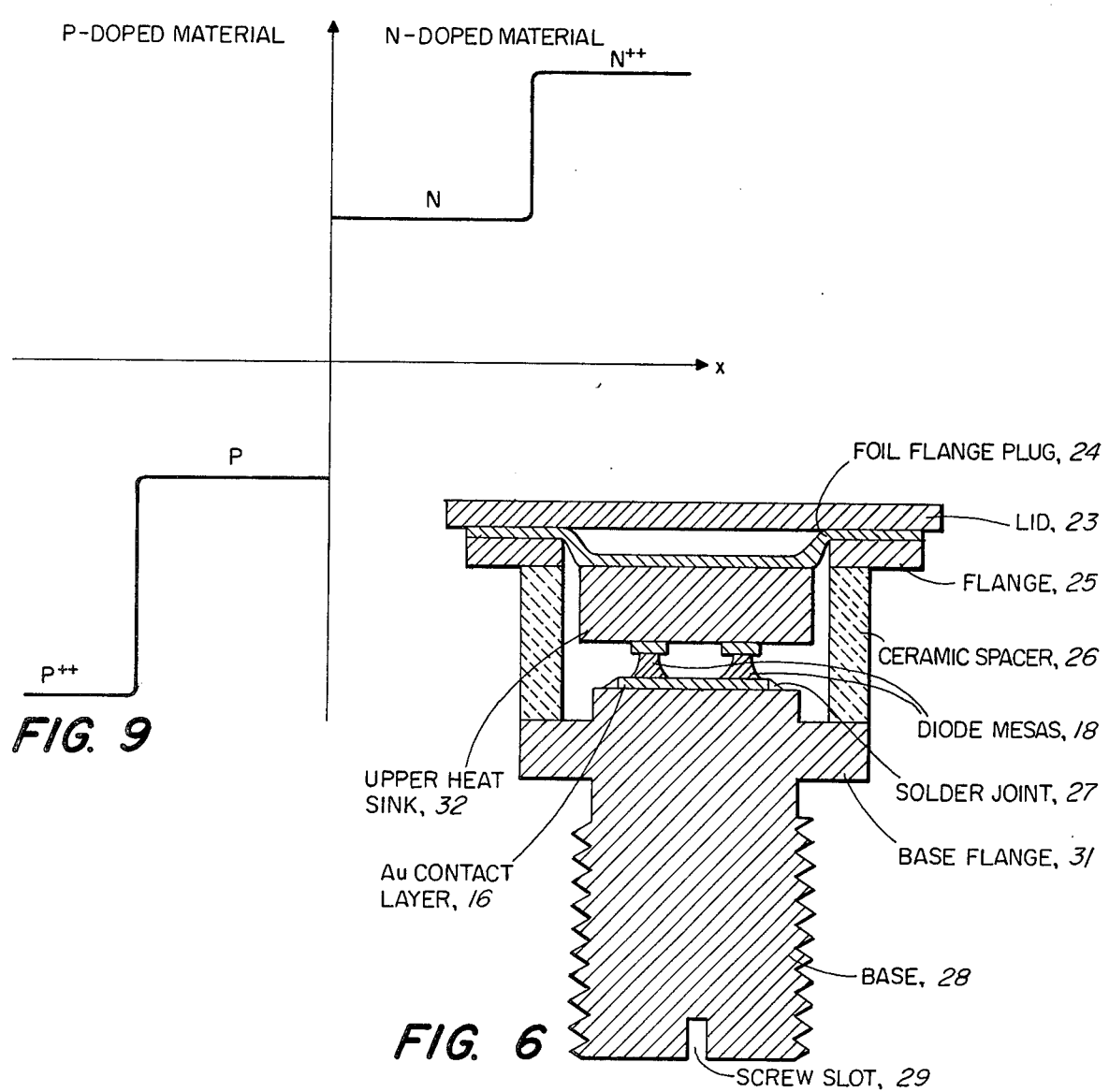
FIG. 9
FIG. 6

PLURAL SEMICONDUCTOR DEVICES MOUNTED BETWEEN PLURAL HEAT SINKS

The invention herein described was made in the course of or under a contract or subcontract thereunder, with the Department of the United States Air Force.

BACKGROUND OF THE INVENTION

1. Field of the Invention

The invention pertains to microwave power semiconductor devices. More particularly, the invention relates to avalanche-type microwave power diodes with improved thermal properties.

2. Description of the Prior Art

Gallium arsenide IMPATT type diodes have recently been developed for use as oscillators in the C and X microwave bands. Efficiencies on the order of 25% to 30% have been found possible for Read-type IMPATT diodes. It has been the practice to mount single-mesa devices upon a single heat sink for most oscillator applications. Power output in such devices has been limited to typically five watts because of the upper limit upon allowable junction temperatures for practical diode chip sizes. For many applications, such as in radars and in communications, a higher power level has been desired. In double-drift type avalanche diodes in which the junction is formed substantially in the center of the semiconductor body relatively far from the heat sink surface, the problem is further exasperated because most of the heat in such a device is generated in the region of the junction and must subsequently flow through long distances of semiconductor material.

SUMMARY OF THE INVENTION

Accordingly, it is an object of the present invention to provide a microwave power diode device having a substantially lower thermal resistance than prior art devices.

Also, it is an object of the present invention to provide a microwave power diode device with overall increased operating power and/or lower junction temperature.

These, as well as other objects of the invention, may be met by providing the combination of first and second bodies of thermally conductive material electrically isolated from one another and a plurality of active semiconductor bodies, each of conductive material and a second surface in thermal contact with the second body of thermally conductive material. The first and second bodies of thermally conductive material are preferably each of larger volume than any of the semiconductor devices or of the total volume of the semiconductor device bodies. The thermally conductive bodies are also preferably electrically conductive. The first and second surfaces of semiconductor device bodies have contacts connected to active elements of the device disposed thereon. In some preferred embodiments, the semiconductor device bodies are substantially identical with one another and are preferably microwave diode device bodies.

The invention may also be practiced by a microwave diode device comprising the combination of a plurality of diode device bodies each of which has first and second parallel surfaces at opposite ends of the device bodies with a planar junction parallel to the two surfaces, a first layer of metal in contact with the first surface of each of the diode devices and in thermal contact with the first surface of the first layer of metal, a first metal heat sink of greater volume than the total volume of the diode device bodies with a second surface of the second layer of metal being in electrical and thermal contact with the first metal heat sink, a plurality of second layers of metal with a first surface of one of the second layers of metal in electrical and thermal contact with each of the second surfaces of the diode device bodies, and a second metal heat sink of greater volume than the total volume of the diode device bodies with a second surface of each of the second layers of metal being in electrical and thermal contact with the second metal heat sink. The diode device bodies, which may be IMPATT diode device bodies, may be three in number and arranged in an equilateral triangular pattern or four in number and arrayed in a rectangular pattern. A Schottky-barrier forming metal contact layer may be disposed between the first layer of metal and the first surface of the diode device bodies.

The invention may further be practiced by a microwave diode device comprising the combination of a metal base having a lower threaded portion, an upper planar surface, and a flanged portion between the upper planar surface and the lower threaded portions, a layer of electrically and thermally conductive metal disposed upon the upper planar surface of the base, at least one diode device body having a first surface in electrical and thermal contact with the first layer of electrically and thermally conductive metal, a second layer of electrically and thermally conductive metal disposed upon a second surface of the diode device body, a body of metal electrically and thermally in contact with the second surface of the diode device body with the body of metal having a larger volume than the total volume of the diode device body, an insulating spacer coupled to the flanged portion of the base, a conducting annularly-shaped flange coupled to the spacer opposite the flanged portion of the base, a flexible metal layer with center portions coupled to the body of the metal and outer portions coupled to the flange, and a disc-shaped lid positioned over the flexible metal layer. The body of metal preferably is formed of copper which may have a layer of gold plated on the outer surface thereof. The layer of electrically and thermally conductive metal may, in some embodiments, have a layer of metal for forming a Schottky-barrier junction with the material of the diode device body. The insulating spacer preferably is formed of a ceramic material.

BRIEF DESCRIPTION OF THE DRAWINGS

FIG. 6 is a cross-sectional view from a completed packaged device in accordance with the invention;

FIG. 9 is a graph showing a preferred doping density profile for the semiconductor material used with the invention; and FIG. 10 is a graph showing an alternative preferred doping density profile for the semiconductor material used with the invention.

DESCRIPTION OF THE PREFERRED EMBODIMENTS

Figure 1:
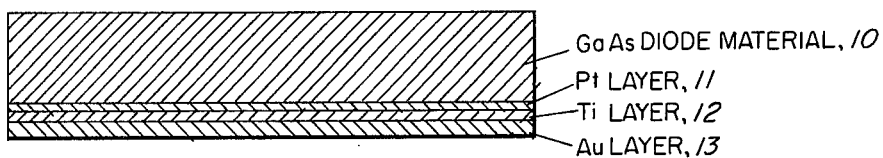
FIGS. 1-4 are a series of cross-sectional views showing steps in the construction of a semiconductor device in accordance with the invention.

Construction of semiconductor devices in accordance with the teachings of the present invention will be initially described in conjunction with the cross-sectional views of FIGS. 1–4. Referring first to FIG. 1, there is shown in cross-section a layer of substrate of gallium arsenide semiconductor diode material 10. Diode material 10 may have one of many different doping density profiles depnding upon the particular application at hand. For example, diode material 10 may have the doping profile of a single-drift region IMPATT avalanche diode. A double-drift region IMPATT avalanche diode doping profile may also be used to particular advantage with the invention.

Referring momentarily to the graph of FIG. 9, the preferred doping profile of the double-drift IMPATT avalanche diode is illustrated. The material is formed in four regions, two of them being doped with an N− or negative-type dopant while the other two are doped with a P− or positive-type dopant. A diode junction is formed substantially at the center of the material between the P and N moderately doped layers. Avalanching of charge carriers takes place on either side of the diode junction within a portion both the P and N layers. The positive and negative charge carriers generated by avalanching are pulled by an electric field outward toward the P++ and N++ heavily doped region producing a time delay between the time of generation of the carriers near the diode junction and the time they reach the heavily-doped region. This time delay corresponds to an 180° phase shift between input and output signals and a diode circuit. The charge carriers in both the P and N regions, upon reaching the P++ and N++ regions respectively, recombine producing a conduction current in the output circuitry. A particular diode device used with the invention which has been found to function well with an N doping density of approximately $1.5 \times 10^{16}/cm^2$, a doping density in the N++ region of $2 \times 10^{18}/cm^3$, a density of $1.3 \times 10^{16}/cm^3$ in the P region and a doping density of approximately $10^{19}/cm^3$ in the P++ region. The N layer may have a width in the range of 3.5 to 4.5 microns depending upon the frequency of operation desired. For the same range of frequencies, the P region may have a width in the range of 3.0 to 3.5 microns. Widths of 5.0 to 8.0 microns for the N++ layer and approximately 1.0 micron for the P++ layer have been found to function adequately.

Most of the heat generated within the material having the doping density profile shown in FIG. 9 is produced in the avalanche regions adjacent the diode junction in the center of the device. The maximum amount of power which can be handled with such a device is, of course, dependent upon the junction temperature. The junction temperature is in turn dependent upon the rate at which heat may be extracted from the device. Since with the double-drift structure it is not possible to place a heat sink immediately adjacent the junction because of the presence of active material extending for appreciable distances on both sides of the junction, heat removal has been a serious problem severely limiting the maximum power at which such devices may be employed.

Referring now to FIG. 10, there is shown a graph of a single-drift Read-type IMPATT diode with which the invention may also be used to advantage. An avalanche region is formed with an N-type semiconductor material adjacent a metal layer suitable for forming a Schottky-barrier junction. A layer of platinum may be used with gallium arsenide semiconductor material to form such a junction. A thin doping spike of heavily doped semiconductor material terminates the avalanche region and confines the avalanche of charge carriers strictly between the layer of Schottky-barrier forming metal and the doping spike. The charge carriers produced within the avalanche region are pulled through the drift region of moderately-doped material by the externally applied electric field. Upon reaching the termination region, the charge carriers recombine forming a conduction current which flows in the external circuitry. A two-layered heavily-doped termination region may be used with the layer immediately adjacent the drift region being less heavily doped to prevent carrier injection from defects at the interface between the drift region and termination region and the consequent generation of an unwanted reverse current. As in the previously described double-drift avalanche diode, heat removal is also a severe problem with this type of device.

Referring again to FIG. 1, the steps in the construction of a device in accordance with the teachings of the present invention will be discussed in further detail. For use with diode material having a doping density in accordance with that specified in FIG. 10, a three-layer metallization pattern is deposited over one surface of diode material 10 with a layer of Schottky-barrier forming metal in contact with the surface of diode material 10. For the case of the double-drift structure shown in FIG. 10, the highly doped P++ layer may be omitted as the three-layer metallization described will form a good ohmic contact with P-type gallium arsenide material. Also, with the double-drift IMPATT avalanche diode specified in FIG. 9, the three-layer metallization may be replaced, for example, by some other metallization system. With the embodiment shown in FIG. 1, first a layer of platinum 11 is sputtered upon the surface of gallium-arsenide diode material 10. Upon platinum layer 11 is then sputtered layer 12. Titanium is the preferred material although tungsten, hafnium, or other refractory metals may be used as well for layer 12. Next, gold layer 13 is sputtered over titanium layer 12. Highly conductive gold layer 13 is sputter deposited upon titanium layer 12 and forms the lower contact to the diode.

In accordance with one aspect of the invention, a particularly advantageous sputtering process is used which results in a device in which the gold layer is prevented from diffusing through the platinum layer into diode material 10 and adversely affecting some of the electrical properties of the material. In accordance with the invention, diode material 10 is first heated to a temperature in the range of 300° to 350° C. with 330° C. being a preferred operating point. Platinum layer 11 is then sputtered upon the surface of diode material 10 with a sputtering power in the range of 0.5 to 2.7 watts/cm$^2$ with a preferred operating point of 0.8 watts/cm$^2$ to a preferred thickness in the range of 100 to 300 Å. A thickness of 200 Å has been found to function well. During this initial sputtering operation, a portion of platinum layer 11 reacts with the gallium arsenide material forming an alloy therewith. Diode material 10 is then cooled to a temperature in the range of 20° to 40° C. with 30° C. being a preferred operating point, and a layer 12 of titanium having a thickness in the range of 1000 Å to 2000 Å is sputtered over platinum layer 11 at a relatively high sputtering power level in the preferred range of 1.4 to 4.4 watts/cm$^2$ with a preferred operating point of 2.7 watts/cm$^2$. The relatively high titanium power level causes impact alloying between the remaining platinum and the titanium material forming a compound which reacts chemically much more slowly with gallium arsenide than does pure platinum. Moreover, atoms of gold layer 13 are not able to migrate through the barrier thus formed. Still further, it has unexpectedly been found that diode devices constructed in accordance with the abovedescribed sputtering process exhibit substantially lower noise measures than for diodes having an ordinary Schottky-barrier contact with the gold layer immediately adjacent the Schottky-barrier forming metal.

Figure 2:
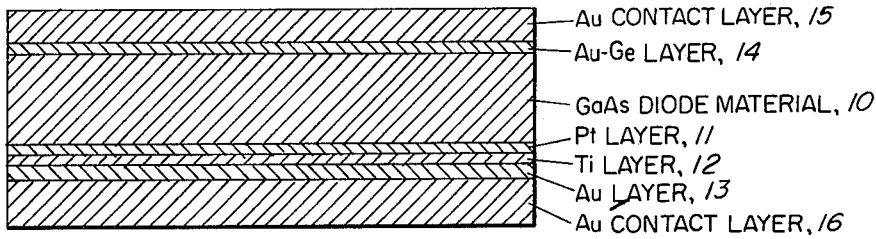

Referring next to FIG. 2, a layer of gold-germanium eutectic alloy is evaporated upon the surface of gallium arsenide diode material 10 opposite that upon which the platinum-titanium-gold layers were deposited. This surface corresponds to the outer side of the termination region of a device having a profile shown in FIG. 10. Atop gold-germanium layer 14 is plated gold contact layer 15. Similarly, gold contact layer 16 is plated above previously deposited gold layer 13.

Figure 3:
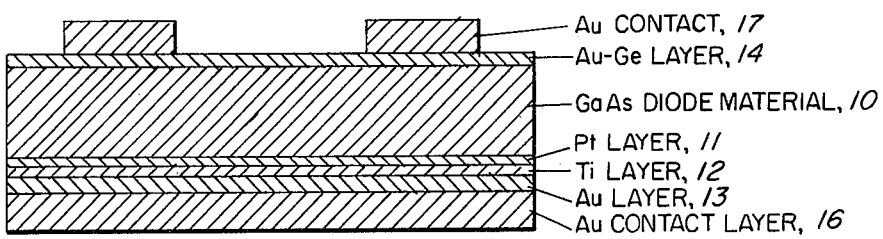

Next, as shown in the view of FIG. 3 gold-contact layer 15 is masked and chemically etched away in predetermined locations using well-known photoresist techniques to leave a plurality of circular gold contacts 17 atop positions at which diode mesas are to be formed. Ordinarily, many more contacts could be formed upon a single semiconductor wafer than are herein shown. For large-scale production, many hundreds of such contacts could be formed upon one wafer then the diode mesa devices diced apart singly or in groups as desired.

Figure 4:
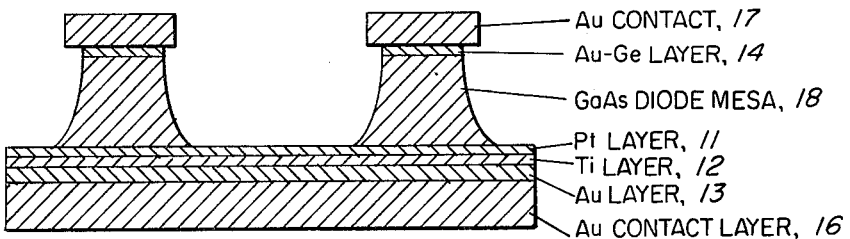

Next, as illustrated in the view of FIG. 4, gold-germanium layer 14 and portions of diode material 10 are chemically etched away between gold contacts 17 to form individual diode mesas 18. A top view of the device at this stage of fabrication is shown in the view of FIG. 5.

Figure 5:
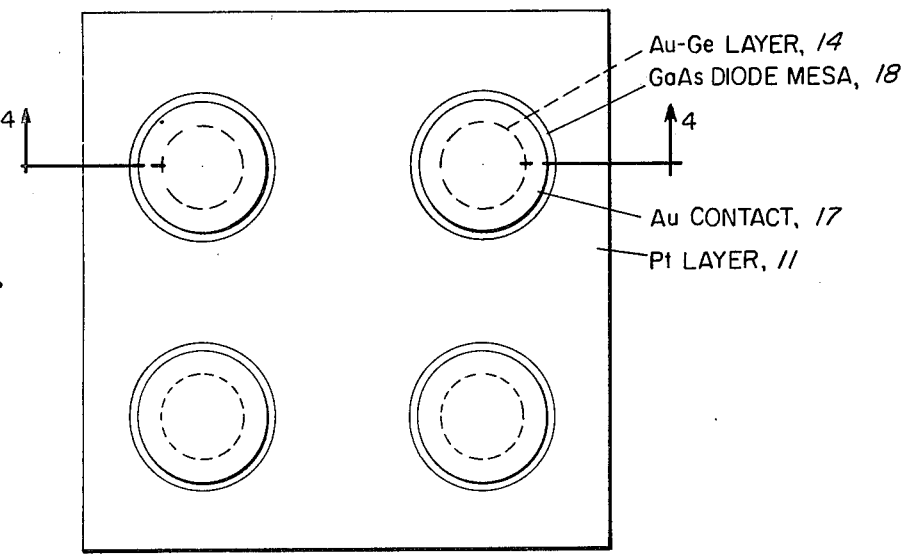
FIG. 5 is a top view of the device as shown in FIG. 4.

Referring next to the cross-sectional view of FIG. 6, there is shown the four-mesa device of FIGS. 4 and 5 assembled in a double-heat sink microwave diode package in accordance with the invention. Gold-contact layer 16 is soldered to the upper surface of metallic diode base 28 with solder joint 17. Diode base 28 is preferably a highly thermally and electrically conductive metal such as copper which may have a coating of gold on its outer surface. The lower portion of base 28 is threaded and provided with a screw slot 29 for package mounting.

Base 28 forms a heat sink for the heat produced within diode mesas 18 and transmitted through gold-contact layer 16. Base flange 31 is provided around the upper portions of diode base 28 to form support for cylindrically-shaped ceramic spacer 26. Ceramic spacer 26 is both thermally and electrically insulating. Annularly-shaped flange 25 is secured atop ceramic spacer 26.

In accordance with the invention, upper heat sink 32 is provided within the interior space of ceramic spacer 26 in electrical and thermal contact with gold contacts 17 of diode mesas 18. Upper heat sink 32 is formed of a highly thermally and electrically conductive metal such as gold-plated copper as used for base 28. The volume of upper heat sink 32 should be much larger than that of diode mesas 18 to provide a low thermal resistance for heat flowing out of the upper ends of diode mesas 18. A flexible foil-flanged plug 24, in thermal and electrical contact with the upper surface of upper heat sink 32, is secured to the upper surface of flange 25. A metal lid 23 covers and is also an electrical and thermal contact with foil-flanged plug 24. In actual device operation, such as in an amplifier or oscillator circuit, a contact rod abuts the surface of lid 23 providing continuation of the upper heat path.

The device shown in FIG. 6 has numerous advantages over the devices of prior art in its heat-flow characteristics allowing it to be employed at higher power levels than were heretobefore possible with diode devices of similar dimensions. First, by providing multiple diode mesas, rather than a single mesa of the same total junction area, the thermal resistance between the junction or any point within any one of the diode mesas is substantially lower than for a larger single mesa device. An arrangement of three mesas or other devices in a substantially equilateral triangular arrangement, or four devices in a rectangular arrangement is preferred. Secondly, because heat sinks are provided upon both sides of the diode mesas, heat may flow outwardly from two directions from the heat generating areas within the diode material. In this manner, a second large reduction in overall thermal resistance and hence junction temperature is achieved.

Figure 7:
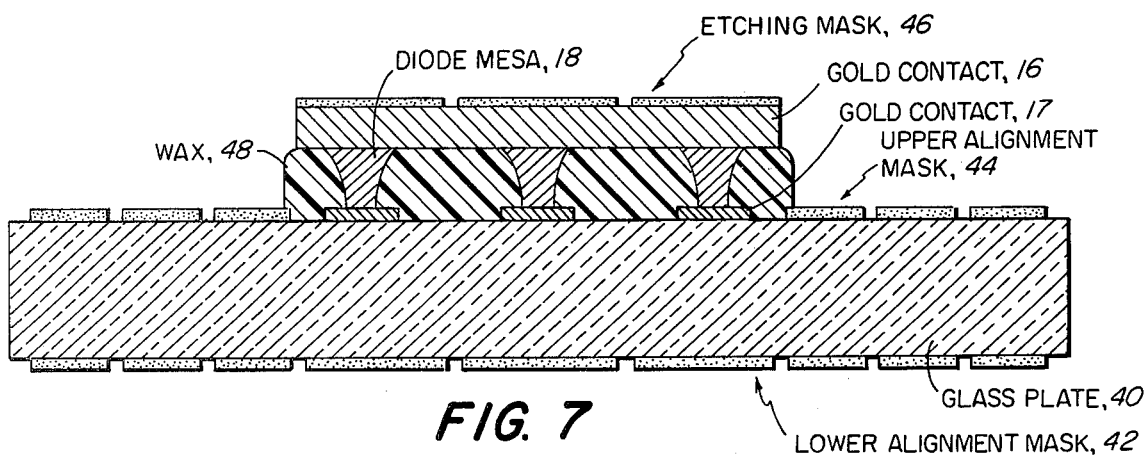
FIG. 7 is a cross-sectional view showing steps in a dicing operation in accordance with the invention.

Referring next to FIG. 7, there is shown a cross-sectional view useful in explaining a dicing procedure in accordance with the invention. A device in the same state of construction as illustrated in FIGS. 4 and 5 is mounted upon transparent glass plate 40 with a nonreactive wax 48 filling the space between and around diode mesas 18 and gold contact 17. The wax protected device is pressed against the upper surface of glass plate 40 with gold contacts abutting the surface. From the lower surface of glass plate 40 it is then possible to visually distinguish between gold contacts 17 and wax 48 lying therebetween hence making it possible to determine where the dicing cuts are to be made.

The lower surface of glass plate 40 is then covered with a transparent layer of photoresist material which is masked with a photographic mask having lines corresponding to the positions of the dicing cuts and exposed to form lower alignment mask 42 having lines corresponding to those along which the dicing cuts are to be made through gold contact layer 16. Other such lines are provided for alignment purposes in a grid pattern beyond the periphery of wax 48.

Next, a second layer of photoresist material is deposited upon the upper surface of glass plate 40 and the upper surface of gold-contact layer 16. The same mask which was used to expose lower alignment mask 42 is aligned visually with the portions of the grid pattern extending beyond the periphery of wax 48. The photoresist layer is then exposed and chemically etched to remove the photoresist material in the lines along which dicing is to be made.

Figure 8:
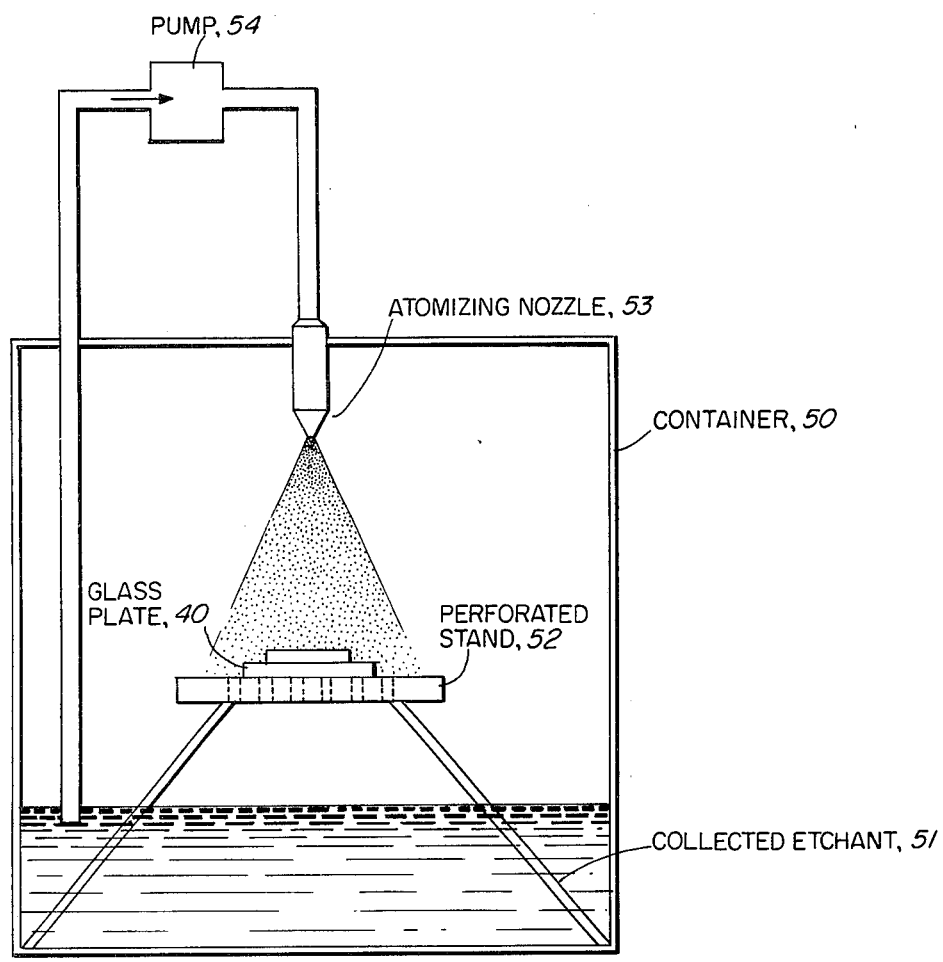
FIG. 8 shows a cross-sectional view of a spray-etching operation as used in the dicing operation of the invention.

The device at the stage of construction as shown in FIG. 7 is then placed within a spray-etching system illustrated in FIG. 8. The device is placed upon perforated stand 52 positioned above a tank of collected etchant 51. Pump 54 circulates the collected etchant 51 through atomizing nozzle 53 spraying it toward the exposed dicing lines. The etching process continues until the desired portions of gold-contact layer 16 have been completely etched through. Wax 48 is then removed allowing the devices to be separated.

Of course, as before, many more than three diode mesas would ordinarily be provided on a wafer that is being diced, three only being shown for clarity of illustration. The same technique may be employed for etching apart single diode mesas or groups of diode mesas. It may also be readily appreciated that any shape heat sink may be produced with the technique of the invention. For example, a circular heat sink may be produced for a device having three mesas positioned in an equilateral triangular arrangement so that each mesa has the same effective thermal resistance. This could not have been done with the rectilinear techniques of the prior art.

This completes the description of the preferred embodiments of the invention. Although preferred embodiments have been described, it is believed that numerous modifications and alterations thereto would be apparent to one having ordinary skill in the art without departing from the spirit and scope of the invention.

What is claimed is:

1. A microwave diode device comprising in combination:
   a metal base, said base having a lower threaded portion, an upper planar surface, and a flanged portion between said upper planar surface and said lower threaded portion;
   a layer of electrically and thermally conductive metal disposed upon said upper planar surface of said base;
   a plurality of diode device bodies having a first surface in electrical and thermal contact with said first layer of electrically and thermally conductive metal;
   a second layer of electrically and thermally conductive metal disposed upon a second surface of said plurality of diode device bodies;
   a body of metal electrically and thermally in contact with a second surface of said plurality of diode device bodies, said body of metal having a larger volume than the volume of said plurality of diode device bodies;
   an insulating spacer having a hollow cylindrical shape, one end of said spacer coupled to said flanged portion of said base;
   a conducting annularly shaped flange coupled to the end of said spacer opposite said flanged portion;
   a flexible metal layer, center portions of said flexible metal layer being coupled thermally to said body of metal and outer portions of said flexible metal layer being coupled to said flange; and
   a disc-shaped lid positioned over said flexible metal layer.

2. The combination of claim 1 wherein said base and said body of metal comprise:
   copper.

3. The combination of claim 2 wherein said base and said body of metal are each covered with a layer of gold.

4. The combination of claim 1 wherein said layer of electrically and thermally conductive metal comprises:
   a layer of metal which forms a Schottky-barrier junction with the material of said plurality of diode device bodies.

5. The combination of claim 1 wherein said insulating spacer comprises:
   a ceramic material.

* * * * *